United States Patent [19]
Okubo et al.

[11] Patent Number: 6,064,271
[45] Date of Patent: May 16, 2000

[54] VOLTAGE CONTROLLED OSCILLATOR CIRCUIT AND DISC REPRODUCING APPARATUS

[75] Inventors: Mamiko Okubo, Kawasaki; Hiroshi Shimada, Kamakura, both of Japan

[73] Assignee: Kabushiki Kaisha Toshiba, Kawasaki, Japan

[21] Appl. No.: 09/104,995

[22] Filed: Jun. 26, 1998

[30] Foreign Application Priority Data

Jun. 26, 1997 [JP] Japan ..................................... 9-185733

[51] Int. Cl.[7] ....................................................... H03L 7/00
[52] U.S. Cl. ................................................. 331/2; 331/34
[58] Field of Search ..................... 331/2, 34, 57, 331/179, 1 A, 17, 25; 327/158, 276, 277, 281; 360/51

[56] References Cited

U.S. PATENT DOCUMENTS

| | | | |
|---|---|---|---|
| 5,039,893 | 8/1991 | Tomisawa | 307/597 |
| 5,216,302 | 6/1993 | Tanizawa | 307/603 |
| 5,487,093 | 1/1996 | Adresen et al. | 375/376 |
| 5,526,339 | 6/1996 | Shimada . | |
| 5,585,754 | 12/1996 | Yamashina et al. | 327/158 |
| 5,663,665 | 9/1997 | Wang et al. | 327/5 |

FOREIGN PATENT DOCUMENTS 63-69314  3/1988  Japan ..................................... 327/277

*Primary Examiner*—Robert Pascal
*Assistant Examiner*—Henry Choe
*Attorney, Agent, or Firm*—Oblon, Spivak, McClelland, Maier & Neustadt, P.C.

[57] ABSTRACT

In a disc reproducing apparatus using a VCO (voltage controlled oscillator) circuit, the VCO circuit includes a first delay cell array having gates supplied with a first control voltage DCV, a ring oscillator including a second delay cell array having gates supplied with a second control voltage Vin, and a switch for selecting the number of delay cells from the second delay cell array. The oscillation frequency of the ring oscillator is determined by a time delay of the second delay cell array. When the second control voltage Vin having the same value as the first control voltage DCV is inputted to the gates of the delay cells of the second delay cell array, the ring oscillator oscillates with a frequency determined by the ratio of the number of the delay cells of the first delay cell array to number of the delay cells of the second delay cell array. By operating the selection switch to change the number of delay cells constituting the second delay cell array, the voltage controlled oscillator (VCO) circuit can generates a signal of an oscillation frequency of a frequency division ratio other than $½^n$, by using at least one reference clock.

20 Claims, 4 Drawing Sheets

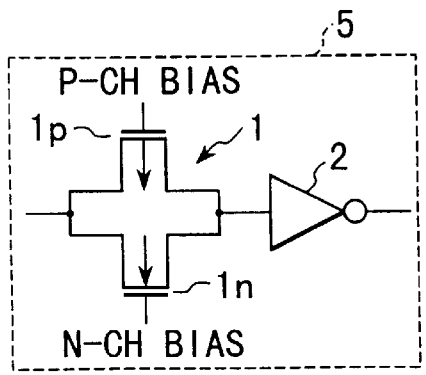
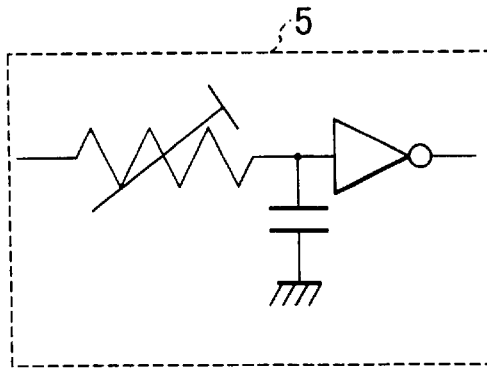
FIG. 7A    FIG. 7B
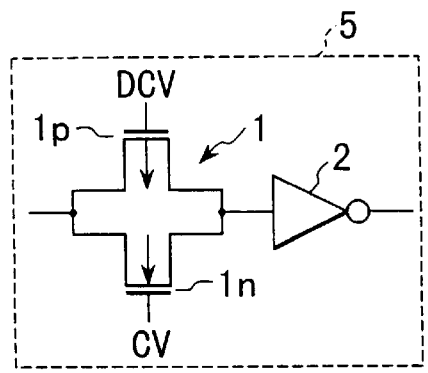
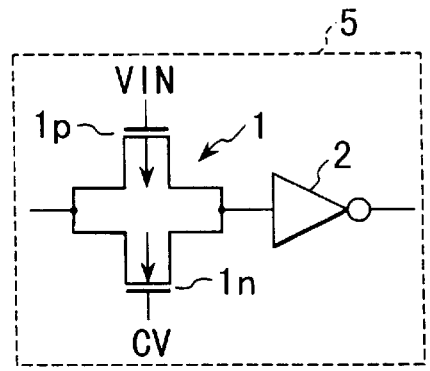
FIG. 7C    FIG. 7D
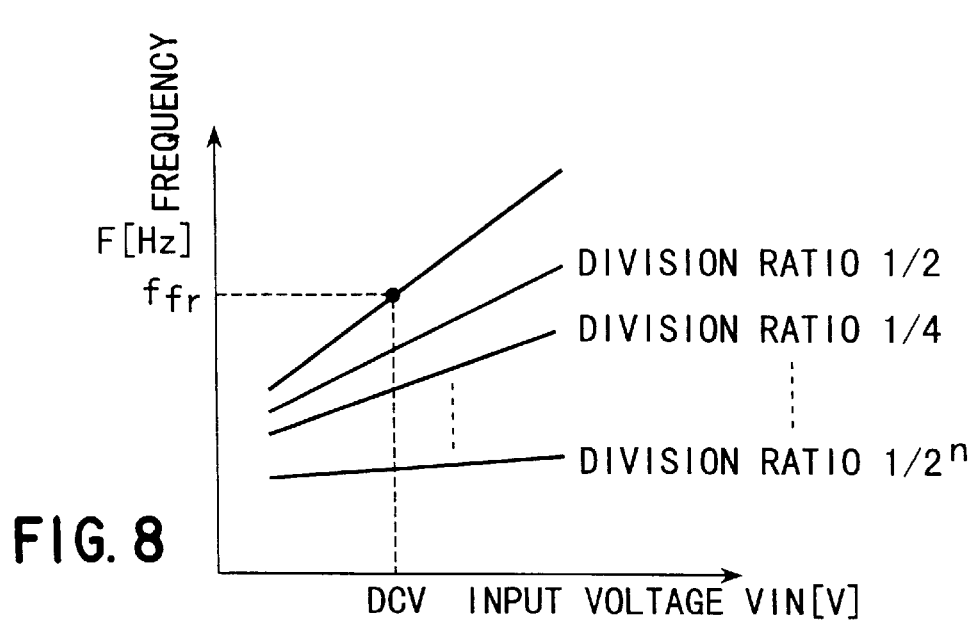
FIG. 8

VOLTAGE CONTROLLED OSCILLATOR CIRCUIT AND DISC REPRODUCING APPARATUS

BACKGROUND OF THE INVENTION

The present invention relates to an optical disc reproducing apparatus for compact discs (CDs) or the like, and in particular to a voltage controlled oscillator (VCO) circuit included in a PLL (phase-locked loop) circuit for generating a clock signal synchronized with a reproduced signal.

In the field of acoustic devices, digital recording and reproducing systems are now being developed. In order to conduct recording and reproducing data with high density and high fidelity, these systems convert an audio signal to a digital signal by using the PCM (Pulse Code Modulation) technique, record the digital signal on a recording medium such as a disc or magnetic tape, and reproduce the recorded digital signal.

A disc reproducing apparatus for reproducing data from the disc rotates the disc by a motor with CLV (Constant Linear Velocity) or CAV (Constant Angular Velocity), using a motor control circuit.

FIG. 5 is a block diagram of a conventional disc reproducing apparatus. By conducting linear tracking from the inner track side to the outer track side of a disc 15 rotated by a disc motor 16, an optical pickup device 9 reads data recorded on the disc 15 as a reproduced signal and converts it into a current signal.

The data (current signal) thus read is supplied to an amplifier 10. The amplifier 10 converts the current signal to a wideband voltage signal (hereafter referred to as RF signal), and supplies the wideband voltage signal to a data slice circuit 17. The data slice circuit 17 converts the output voltage signal (the reproduced signal) of the amplifier 10 to a binary signal, and supplies the binary signal to a PLL (Phase Locked Loop) circuit 18 and a data processing circuit 11 as an EFM (Eight to Fourteen Modulation) signal. The PLL circuit 18 generates a clock signal PLCK in accordance with a change of data reproduction velocity, on the basis of the binary output signal generated by the data slice circuit 17. The data processing circuit 11 separates a synchronizing signal from the EFM signal, and conducts an EFM demodulation to separate the EFM signal into a 32-symbol data component including parity data P and Q, and a sub-code component. The EFM demodulated data, i.e. reproduced data, is written into a memory (not shown) from the data processing circuit 11, by using a clock signal PLCK generated by the PLL circuit 18. The data written into the memory is read out from the memory with a system reference clock signal XCK generated by using a crystal resonator, and thus the time axis variation caused by the motor is corrected. The data read out from the memory is subject to error correction, and the corrected data is outputted as 16-bit digital data.

The control of the reproduction velocity is conducted by a system controller 20. The system controller 20 generates a reproduction velocity control HS. This HS signal specifies the reproduction velocity, for example, a general reproduction velocity (referred to as unity time velocity) or a velocity equivalent to twice the reference velocity (referred to as double velocity). The reproduction velocity has become increased up to over-forty times the reference velocity in recent technology. The control signal HS is supplied to the data processing circuit 11 and a motor control circuit 19 to change the processing velocity and the disc reproduction velocity to desired velocities. The control signal HS is also supplied to the data slice circuit 17. In according with the control signal HS, the data slice circuit 17 changes the control frequency band so as to correspond to the reproduction velocity.

The PLL circuit includes a VCO circuit for generating an output signal and a phase-locked loop (PLL section). The PLL section detects a phase difference between a signal obtained by applying frequency division to the output signal of the VCO circuit so as to reach a predetermined low frequency and a reference signal of a fixed frequency and supplies a control voltage corresponding to the phase difference to the VCO circuit. In other words, the PLL section controls the output signal of the VCO circuit until such a phase-locked state that the signal obtained by applying frequency division to the output signal of the VCO circuit coincides in phase with the reference signal is reached. The PLL section has a loop filter for converting a signal (current) corresponding to the phase difference to the control voltage.

FIG. 6 shows a block diagram of a conventional VCO circuit of type of a delay line ring oscillator used in general within semiconductor integrated circuits (LSIs) of CMOS structure. A reference block (first delay cell array) is formed of n delay cells 5 connected in series to each other. An oscillation block (second delay cell array) forming a ring oscillator includes, for example, four delay cells 5 connected in series to each other.

FIG. 7A shows an example of a circuit of each of the delay cells 5 used in the first delay cell array and the second delay cell array of the VCO circuit shown in FIG. 6. As shown in FIG. 7A, each of the delay cells used in the VCO circuit shown in FIG. 6 is formed of a transfer gate 1 and an inverter 2. The transfer gate 1 is formed of a P channel (P-ch) MOS transistor $1p$ and an N channel (N-ch) MOS transistor $1n$. The P channel MOS transistor $1p$ is connected in parallel with the N channel MOS transistor $1n$, and the inverter is connected in series to the source-drain paths of the MOS transistors.

FIG. 7B shows an equivalent circuit of the delay cell circuit shown in FIG. 7A. The equivalent circuit includes a variable resistor, an inverter connected in series with the variable resistor, and a capacitor. The capacitor is connected at one end to the junction of the variable resistor and the inverter, and at the other end to ground.

As shown in FIG. 7C, a first control voltage DCV is inputted to the gate of the P-channel MOS transistor $1p$ of the delay cell 5 in the reference block, and an input signal CV is inputted to the gate of the N-channel MOS transistor in of the delay cell 5 in the reference block. A reference clock signal is inputted to the input terminal of the reference block, and a delayed signal fout (delayed clock signal of the inputted reference clock signal) is outputted from the output terminal of the reference block. The reference clock signal is also inputted to a phase comparator (i.e., a phase detector) 3. The phase comparator 3 compares the phase of the reference clock signal with the phase of the output fout (i.e., delayed clock signal of the inputted reference clock signal) obtained by passing the reference clock signal through the reference block, and supplies the result of comparison to a low-pass filter (LPF) 4. The filter 4 extracts only a low frequency components from the output of the result of phase detection conducted by the phase comparator 3. The low frequency components extracted by the filter 4 is supplied to the gates of the N-channel MOS transistors $1n$ of the reference block as the input voltage signal CV, as shown in FIG. 7C.

As shown in FIG. 7D, a second control voltage Vin is inputted to the gate of the P-channel MOS transistor $1p$ of the delay cell 5 in the oscillation block of the ring oscillator, and the input voltage signal CV is also inputted to the gate of the N-channel MOS transistor 1n of the delay cell 5 in the oscillation block. When input voltage signal CV is changed, the on-resistance value of the pair of transistors 1p and in is changed. By a change of the on-resistance value, the time delay of the ring oscillator is changed. By this change, the oscillation frequency of the oscillation block of the ring oscillator is changed.

The output terminal of the oscillation block is connected to the input terminal of an inverter 8, and the output terminal of the inverter 8 is connected to a frequency division circuit 6. The inverter 8 inverts the logic level of the output signal of the oscillation block. After having been level-inverted by the inverter 8, the output signal of the oscillation block is outputted as output signal VOCOout via the frequency division circuit 6. The frequency division circuit 6 divides the output signal of the oscillation block by a frequency division ratio of $½^n$. The output signal of the inverter 8 is also inputted to an input terminal of the oscillation block.

The reference clock signal is compared in phase with the signal fout (i.e., delayed clock signal of the inputted reference clock signal) obtained by passing the reference clock signal through the reference block. The voltage signal CV obtained by removing high frequency components from the result of phase comparison is inputted to the gates of the N-channel MOS transistors 1n in the reference block. The voltage signal CV is controlled so that the time delay of the reference block may coincide with the phase of the reference clock signal. This is called phase-locked state.

When the voltage signal CV in the phase-locked state is inputted as the gate voltage to the gates of the N-channel MOS transistors 1n in the oscillation block and the same value as the first control voltage DCV is inputted as the gate voltage (the second control voltage) Vin to the gates of the P-channel MOS transistors in, then the oscillation block oscillates with a free run frequency ffr=[(the number of delay cells in the reference block) / (the number of delay cells in the oscillation block)]×(reference clock frequency). Characteristics of the oscillation frequency ffr of the VCO circuit and the input voltage of the second control voltage Vin in are shown in FIG. 8.

The VCO circuit is such a circuit that its free run frequency can be determined by the ratio of the number of delay cells in the reference block to that in the oscillation block when the reference clock is inputted.

The conventional VCO circuit has such a structure heretofore described. In the currently used VCO circuit, the number of delay cells in the reference block and the number of delay cells in the oscillation block are fixed. If the first control voltage DCV is fixed, therefore, only one free run frequency ffr can be obtained for one reference clock. Therefore, as shown in FIG. 8, only such the output signals can be obtained, which have frequencies obtained by applying frequency division of $½^n$ to the oscillation frequency, using a reference clock. Accordingly, in the case where signals of the frequency division ratio other than $½^n$, a further reference clock must be used.

As described above, only one ratio in the number of delay cells could be set in the conventional technique. For the reproduction velocity of $2^n$ times such as one time, twice, 4 times, 8 times, 16 times, and 32 times, therefore, it can be coped with by generating a free run frequency with a single reference clock and applying frequency division to the free run frequency. For the reproduction velocity of 12 times, 24 times, and so on, other than $2^n$ times, however, the free run frequency had to be generated by using different reference clock generators of different oscillation frequencies. In the case where such a frequency that the frequency division ratio is out of $½^n$ is to be obtained in the existing technique, two or more reference clock generators are required. The reference clock generator is typically a crystal resonator which has a high stability and reliability of oscillation frequency, however, it is expensive and raises a problem of cost.

BRIEF SUMMARY OF THE INVENTION

In view of these circumstances, the present invention has been made, and its object is to provide a voltage controlled oscillator (VCO) circuit capable of generating a signal of an oscillation frequency of a frequency division ratio other than $½^n$, by using one reference clock. Another object is to provide a disc reproducing apparatus using such a VCO circuit.

In accordance with an aspect of the present invention, there is provided a voltage controlled oscillator circuit comprising a first delay cell array including a plurality of delay cells each having a first gate for receiving a first control voltage signal and a second gate, the first delay cell array having an input terminal for receiving a reference clock signal and an output terminal for outputting a delayed clock signal of the reference clock signal; a ring oscillator having a second delay cell array including a plurality of delay cells each having a first gate for receiving a second control voltage signal and a second gate, the second delay cell array having an input terminal and an output terminal, the ring oscillator for outputting from the output terminal of the second delay cell array a signal of a frequency determined by a time delay of the second delay cell array; a selection circuit provided for at least one of the first and second delay cell arrays, for selecting the number of delay cells out of the at least one delay cell array; and a phase detector for comparing in phase the reference clock signal with the delayed clock signal outputted by the first delay cell array to output a comparison signal, and inputting the comparison signal to the second gates of the delay cells of the first delay cell array and the second gates of the delay cells of the second delay cell array.

In the voltage controlled oscillator circuit provided according to the above aspect of the present invention, the selection circuit selects the number of delay cells in the first delay cell array.

In the voltage controlled oscillator circuit provided according to the above aspect of the present invention, the selection circuit selects the number of delay cells in the second delay cell array.

In the voltage controlled oscillator circuit provided according to the above aspect of the present invention, the selection circuit selects the number of delay cells in the first delay cell array and the number of delay cells in the second delay cell array.

In the voltage controlled oscillator circuit provided according to the above aspect of the present invention, the selection circuit comprises a disconnecting circuit for disconnecting from the first delay cell array at least one of the delay cells of the first delay cell array.

In the voltage controlled oscillator circuit provided according to the above aspect of the present invention, the selection circuit comprises a disconnecting circuit for disconnecting from the second delay cell array at least one of the delay cells of the second delay cell array.

In the voltage controlled oscillator circuit provided according to the above aspect of the present invention, the selection circuit comprises a first disconnecting circuit for disconnecting from the first delay cell array at least one of the delay cells of the first delay cell array, and a second disconnecting circuit for disconnecting from the second delay cell array at least one of the delay cells of the second delay cell array.

In the voltage controlled oscillator circuit provided according to the above aspect of the present invention, the disconnecting circuit comprises a switch connected between the output terminal of the first delay cell array and an input terminal of one of the delay cells of the first delay cell array.

In the voltage controlled oscillator circuit provided according to the above aspect of the present invention, the disconnecting circuit comprises a switch connected between the output terminal of the second delay cell array and an input terminal of one of the delay cells of the second delay cell array.

In the voltage controlled oscillator circuit provided according to the above aspect of the present invention, the first disconnecting circuit comprises a switch connected between the output terminal of the first delay cell array and an input terminal of one of the delay cells of the first delay cell array, and the second disconnecting circuit comprises a switch connected between the output terminal of the second delay cell array and an input terminal of one of the delay cells of the second delay cell array.

In the voltage controlled oscillator circuit provided according to the above aspect of the present invention, the switch of the disconnecting circuit comprises a clocked inverter connected between the output terminal of the first delay cell array and the input terminal of one of the delay cells of the first delay cell array.

In the voltage controlled oscillator circuit provided according to the above aspect of the present invention, the switch of the disconnecting circuit comprises a clocked inverter connected between the output terminal of the second delay cell array and the input terminal of one of the delay cells of the second delay cell array.

In the voltage controlled oscillator circuit provided according to the above aspect of the present invention, the switch of the first disconnecting circuit comprises a clocked inverter connected between the output terminal of the first delay cell array and the input terminal of one of the delay cells of the first delay cell array, and the switch of the second disconnecting circuit comprises a clocked inverter connected between the output terminal of the second delay cell array and the input terminal of one of the delay cells of the second delay cell array.

In the voltage controlled oscillator circuit provided according to the above aspect of the present invention, the voltage controlled oscillator circuit further comprises a low pass filter for receiving the comparison signal outputted from the phase detector, the comparison signal outputted from the phase detector being inputted via the low pass filter to the second gates of the delay cells of the first delay cell array and the second gates of the delay cells of the second delay cell array.

In the voltage controlled oscillator circuit provided according to the above aspect of the present invention, the voltage controlled oscillator circuit further comprises a frequency division circuit for frequency dividing an output signal of the second delay cell array by frequency division ratio of ½".

In the voltage controlled oscillator circuit provided according to the above aspect of the present invention, the voltage controlled oscillator circuit further comprises an inverter for receiving the output signal of the second delay cell array to invert an logic level of the output signal of the second delay cell array, the output signal of the second delay cell array being inputted via the inverter to the frequency division circuit.

In the voltage controlled oscillator circuit provided according to the above aspect of the present invention, each of the delay cells in the first and second delay cell arrays comprises a transfer gate for receiving an input signal to output a delayed signal, and an inverter for receiving the delayed signal outputted from the transfer gate to invert a logic level of the delayed signal of the transfer gate.

In the voltage controlled oscillator circuit provided according to the above aspect of the present invention, the transfer gate of each of the delay cells of the first delay cell array comprises a pair of P channel MOS transistor and N channel MOS transistor whose drain-source paths are connected in parallel to each other and whose gates receive the first control voltage signal and the comparison signal outputted from the phase detector, respectively.

In the voltage controlled oscillator circuit provided according to the above aspect of the present invention, the transfer gate of each of the delay cells of the second delay cell array comprises a pair of P channel MOS transistor and N channel MOS transistor whose drain-source paths are connected in parallel to each other and whose gates receive the second control voltage signal and the comparison signal outputted from the phase detector, respectively.

In accordance with another aspect of the present invention, there is provided a disc reproducing apparatus comprising a photoelectric converter for optically reading data recorded on a disc and converting the data to an electric signal; an amplifier for amplifying the electric signal outputted from the photoelectric converter; a data slice circuit for generating a binary signal of the electric signal outputted from the amplifier; a PLL circuit for generating a clock signal in accordance with a change of data reproduction velocity, on the basis of the binary signal generated by the data slice circuit; and a data processing circuit for demodulating the binary signal generated by the data slice circuit to reproduce data in response to the clock signal, wherein the PLL circuit comprises a first delay cell array including a plurality of delay cells each having a first gate for receiving a first control voltage signal and a second gate, the first delay cell array having an input terminal for receiving a reference clock signal and an output terminal for outputting a delayed clock signal of the reference clock signal; a ring oscillator having a second delay cell array including a plurality of delay cells each having a first gate for receiving a second control voltage signal and a second gate, the second delay cell array having an input terminal and an output terminal, the ring oscillator for outputting from the output terminal of the second delay cell array a signal of a frequency determined by a time delay of the second delay cell array; a selection circuit provided for at least one of the first and second delay cell arrays, for selecting the number of delay cells out of the at least one delay cell array; and a phase detector for comparing in phase the reference clock signal with the delayed clock signal outputted by the first delay cell array to output a comparison signal, and inputting the comparison signal to the second gates of the delay cells of the first delay cell array and the second gates of the delay cells of the second delay cell array.

In the present invention, two or more ratios in number of the delay cells can be established, with the structure heretofore described. Therefore it has become possible to cope with various reproduction velocities by using one reference clock generator. A signal of a frequency division ratio other than ½$^n$ can be obtained without increasing the number of the reference clock generator. It can be expected that this results in a reduced cost. Furthermore, since the oscillation circuit can be reduced, power dissipation can also be decreased.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

FIG. 7A shows a circuit diagram of a delay cell;

FIG. 7B shows an equivalent circuit diagram of the delay cell shown in FIG. 7A;

FIG. 7C shows the circuit diagram shown in FIG. 7A, in which voltage signals DCV and CV are inputted to the gates of the MOS transistors;

FIG. 7D shows the circuit diagram shown in FIG. 7A, in which voltage signals Vin and CV are inputted to the gates of the MOS transistors; and FIG. 8 is an oscillation frequency—input voltage characteristic diagram.

DETAILED DESCRIPTION OF THE INVENTION

Hereafter, embodiments of the present invention will be described by referring to drawing.

In accordance with the present invention, a VCO (Voltage Control Oscillator)circuit includes a reference block having a first delay cell array made of a plurality of delay cells, and a ring oscillator constituted by an oscillation block having a second delay cell array formed of a plurality of delay cells. The ring oscillator has an oscillation frequency determined by a time delay of the second delay cell array. The VCO circuit also includes a selection circuit for selecting the number of delay cells of at least one of the first delay cell array and the second delay cell array. According to the present invention, a disc reproducing apparatus includes such a VCO circuit as above-described.

A first embodiment of a VCO circuit according to the present invention will be described by referring to FIG. 1.

Figure 1:
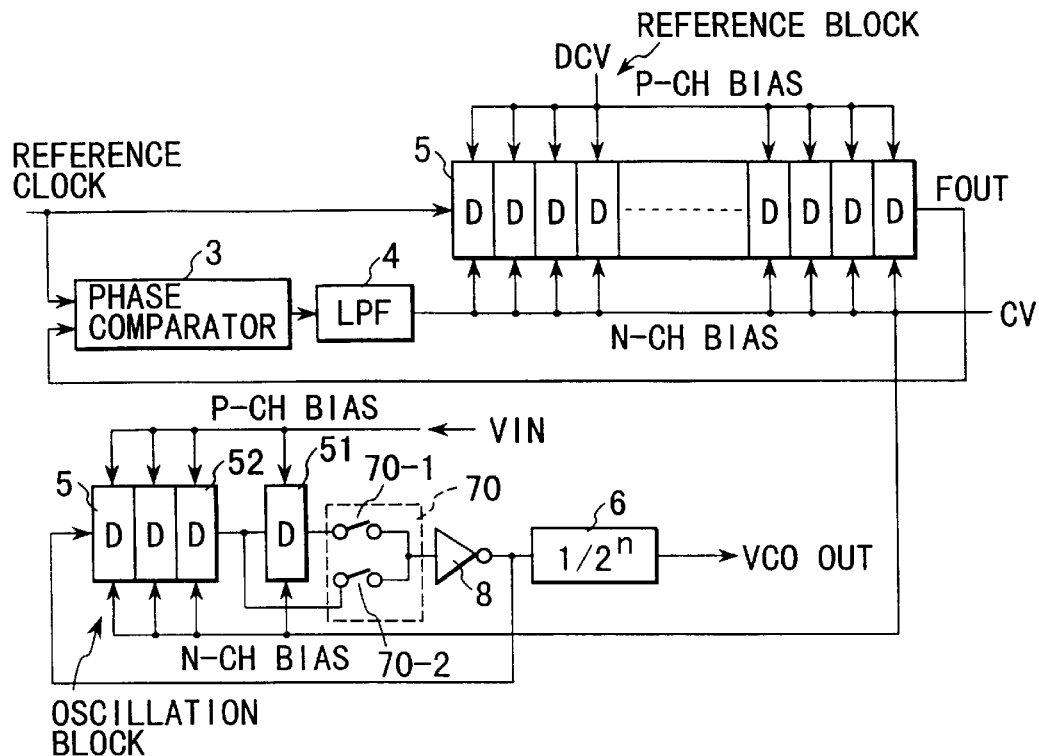
FIG. 1 is a block diagram of a VCO circuit according to a first embodiment of the present invention.

FIG. 1 shows a block diagram of a first embodiment of the VCO circuit, and the VCO circuit is of delay line ring oscillator type used in general within semiconductor integrated circuits (LSIs) of CMOS structure. A reference block (first delay cell array) is formed of n delay cells 5 connected in series to each other. An oscillation block (second delay cell array) forming a ring oscillator includes, for example, four delay cells 5 connected in series to each other.

A delay cell have a structure the same as that shown in FIG. 7A which is used in the first delay cell array and the second delay cell array in the VCO circuit shown in FIG. 7A can also be used as the delay cell 5 in the first delay cell array and the second delay cell array in the VCO circuit shown in FIG. 1. As shown in FIG. 7A, the delay cell 5 is formed of a transfer gate 1 and an inverter 2. The transfer gate 1 is formed of a P channel (P-ch) MOS transistor 1p and an N channel (N-ch) MOS transistor in. The P channel MOS transistor 1p is connected in parallel with the N channel MOS transistor 1n, and the inverter is connected to the source/drain paths in series.

FIG. 7B shows an equivalent circuit of the delay cell circuit shown in FIG. 7A. The equivalent circuit includes a variable resistor, an inverter connected in series with the variable resistor, and a capacitor. The capacitor is connected at one end to the junction of the variable resistor and the inverter, and at the other end to ground.

As shown in FIG. 7C, a first control voltage DCV is inputted to the gate of the P-channel MOS transistor 1p of the delay cell 5 in the reference block in the VCO circuit shown in FIG. 1, and an input voltage signal CV is inputted to the gate of the N-channel MOS transistor 1n of the delay cell 5 in the reference block. A reference clock signal is inputted to the input terminal of the reference block, and a delayed signal fout (delayed clock signal of the inputted reference clock signal) is outputted from the output terminal of the reference block. The reference clock signal is also inputted to a phase comparator (i.e., a phase detector) 3. The phase comparator 3 compares the phase of the reference clock signal with the phase of the output fout (i.e., delayed clock signal of the inputted reference clock signal) obtained by passing the reference clock signal through the reference block, and supplies the result of comparison to a low-pass filter (LPF) 4. The filter 4 extracts only a low frequency components from the output of the result of phase detection conducted by the phase comparator 3. The low frequency components extracted by the filter 4 is supplied to the gates of the N-channel MOS transistors in of the reference block as the input voltage signal CV, as shown in FIG. 7C.

As shown in FIG. 7D, a second control voltage Vin is inputted to the gate of the P-channel MOS transistor 1p of the delay cell 5 in the oscillation block of the ring oscillator, and an input voltage signal CV is inputted to the gate of the N-channel MOS transistor in of the delay cell 5 in the oscillation block. When input voltage signal CV is changed, the on-resistance value of the pair of transistors 1p and 1n is changed. By a change of the on-resistance value, the time delay of the ring oscillator is changed. By this change, the oscillation frequency of the oscillation block of the ring oscillator is changed.

The output terminal of the oscillation block is connected to the input terminal of an inverter 8, and the output terminal of the inverter 8 is connected to a frequency division circuit 6. The inverter 8 inverts the logic level of the output signal of the oscillation block. After having been level-inverted by the inverter 8, the output signal of the oscillation block is outputted as output signal VCOout via the frequency division circuit 6. The frequency division circuit 6 divides the output signal of the oscillation block by a frequency division ratio of $½^n$. The output signal of the inverter 8 is also inputted to an input terminal of the oscillation block.

The reference clock signal is compared in phase with the signal fout obtained by passing the reference clock signal through the reference block. The voltage signal CV obtained by removing high frequency components from the result of phase comparison is inputted to the gates of the N-channel MOS transistors 1n in the reference block. The voltage signal CV is controlled so that the time delay of the reference block may coincide with the phase of the reference clock signal. This is called phase-locked state.

When the voltage signal CV in the phase-locked state is inputted as the gate voltage to the gates of the N-channel MOS transistors 1n in the oscillation block and the same value as the first control voltage DCV is inputted as the gate voltage (the second control voltage) Vin to the gates of the P-channel MOS transistors in, then the oscillation block B oscillates with a free run frequency ffr=[(the number of delay cells in the reference block) / (the number of delay cells in the oscillation block)]×(reference clock frequency). Characteristics of the oscillation frequency f fr of the VCO circuit and the input voltage of the second control voltage V in are shown in FIG. 8.

As shown in FIG. 1, in this embodiment, a switch 70 is provided for the oscillation block to select the number of delay cells 5 in the second delay cell array of the oscillation block. The switch 70-1 is provided between the input terminal of the inverter 8 and the output terminal of a delay cell 51 of the second delay cell array of the final stage of the oscillation block. The switch 70-2 is connected between the input terminal of the inverter 8 and a junction between a delay cell 51 and the delay cell 52 one stage prior to the delay cell 51. That is, the switch 70-2 is connected between the input terminal of the inverter 8 and the output terminal of the delay cell 52 or the input terminal of the delay cell 51. By operating the switch 70, the delay cell 51 can be selectively disconnected from the second delay cell array of the oscillation block. For example, when the switch 70-1 is turned on and the switch 70-2 is turned off, then the delay cell 51 is not disconnected from the second delay cell array and the number of delay cells 5 is as maximum as 4. Also, for example, when the switch 70-1 is turned off and the switch 70-2 is turned on, then the delay cell 51 is disconnected from the second delay cell array and the number of delay cells 5 is reduced by one from the maximum 4 and to 3. In this way, by operating the switch 70, the delay cell 51 can be selectively disconnected from the second delay cell array of the oscillation block.

Accordingly, for example, it is now assumed that the number of delay cells of the first delay cell array in the reference block is 16 (n=16), and the number of delay cells of the second delay cell array in the oscillation block is either 4 or 3 according to the changeover of the switch 7. In this case, either free run frequency ffr=(16/4)×(reference clock frequency) or free run frequency f fr=(16/3)×(reference clock frequency) can be selected. In other words, either VCOout=(reference clock frequency) $(½^{n-2})$ or VCOout=(reference clock frequency)×$(1/(3×2^{n-4}))$ can be selected as the output of the VCO circuit. Hence, using a single reference clock, a plurality of signals of different free run frequencies can be obtained, and thus a signal of division ratio of ½n and signals of the other division ratios can be provided.

A second embodiment will now be described by referring to FIG. 2.

Figure 2:
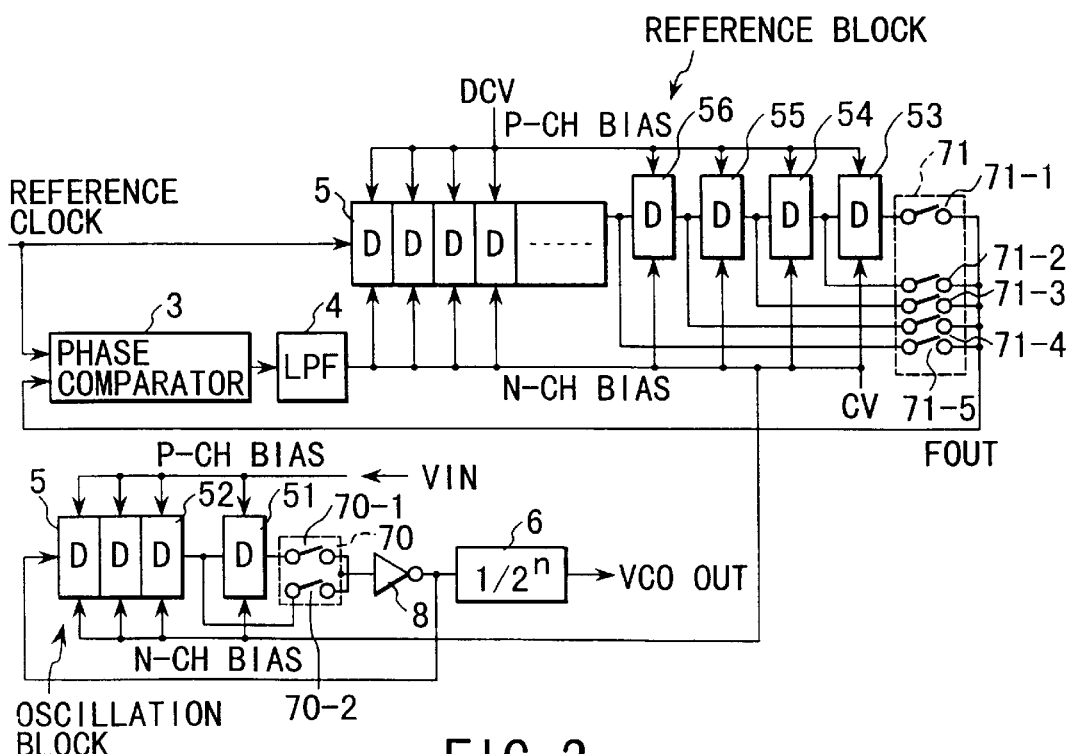
FIG. 2 is a block diagram of a VCO circuit according to a second embodiment of the present invention.

FIG. 2 shows a block diagram of a conventional VCO circuit, and the VCO circuit is of delay line ring oscillator type used in general within semiconductor integrated circuits (LSIs) of CMOS structure. This embodiment basically has the same structure as that of the VCO circuit shown in FIG. 1, except for those portions relating to switches. Therefore, the same portions are designated by the same reference numerals, and the description thereof will be omitted.

As shown in FIG. 2, in this embodiment, similarly to the first embodiment as shown in FIG. 1, a switch 70 is provided for the oscillation block to select the number of delay cells 5 of the second delay cell array of the oscillation circuit. Moreover, in this embodiment, a switch 71 is provided for the reference block to select the number of delay cells 5 of the first delay cell array of the reference block. The switch 70-1 is provided between the input terminal of the inverter 8 and the output terminal of a delay cell 51 of the final stage of the second delay cell array of the oscillation block. The switch 70-2 is connected between the input terminal of the inverter 8 and a junction between a delay cell 51 and the delay cell 52 one stage prior to the delay cell 51. That is, the switch 70-2 is connected between the input terminal of the inverter 8 and the output terminal of the delay cell 52. By operating the switch 70, the delay cell 51 of the second delay cell array can be selectively disconnected from the second delay cell array of the oscillation block. For example, when the switch 70-1 is turned on and the switch 70-2 is turned off, then the delay cell 51 is not disconnected from the second delay cell array and the number of delay cells 5 is as maximum as 4. Also, for example, when the switch 70-1 is turned off and the switch 70-2 is turned on, then the delay cell 51 is disconnected from the second delay cell array and the number of delay cells 5 is reduced by one from the maximum 4 and to 3. In this way, by operating the switch 70, the delay cell 51 can be selectively disconnected from the second delay cell array of the oscillation block.

A switch 71 can disconnect at least one delay cell 5 of the first delay cell array of the reference block from the first delay cell array of the reference block. The switches 71-1, 71-2, 71-3, 71-4, 71-5 are provided at the output sides of delay cells 53, 54 and 55, respectively. The switch 71-5 is provided at the input side of the delay cell 55. That is, The switch 71-1 is connected between the output terminal of the delay cell 53 and the first input terminal of the phase comparator 3, the switch 71-2 is connected between the output terminal of the delay cell 54, the switch 71-3 is connected between the output terminal of the delay cell 55 and the first input terminal of the phase comparator 3, and the switch 71-4 is connected between the output terminal of the delay cell 56 and the first input terminal of the phase comparator 33. The switch 71-5 is connected between the input terminal of the delay cell 56 and the first input terminal of the phase comparator 3. In operation, the switch 71 can disconnect at least one delay cell 5 of the first delay cell array of the reference block from the first delay cell array of the reference block. For example, when the switch 71-1 is turned on and the switches 71-2, 71-3, 71-4, and 71-5 are turned off, then none of the delay cells 53, 54, 55, and 56 is not disconnected from the second delay cell array and the number of delay cells 5 becomes maximum. Also, for example, when the switch 71-2 is turned on and the switches 71-1, 71-3, 71-4, and 71-5 are turned off, then the delay cell 53 is disconnected from the second delay cell array and the number of delay cells 5 is reduced by one from the maximum. Similarly, when the switch 71-3 is turned on and the switches 71-1, 71-2, 71-4, and 71-5 are turned off, then the delay cells 53 and 54 are disconnected from the second delay cell array and the number of delay cells 5 is reduced by two from the maximum. Likewise, when the switch 71-4 is turned on and the switches 71-1, 71-2, 71-3, and 71-5 are turned off, then the delay cells 53 to 55 are disconnected from the second delay cell array and the number of delay cells 5 is reduced by three from the maximum. Further, when the switch 71-5 is turned on and the switches 71-1, 71-2, 71-3, and 71-4 are turned off, then the delay cells 53 to 56 are disconnected from the second delay cell array and the number of delay cells 5 is reduced by four from the maximum. In this way, by operating the switch 71, the delay cell 53, the delay cells 53 and 54, the delay cells 53 to 55, and the delay cells 53 to 56 can be selectively disconnected from the second delay cell array of the oscillation block.

As heretofore described with reference to FIG. 2, in this embodiment (second embodiment), not only that the switch 70 is provided for the oscillation block to select the number of delay cells 5 of the second delay cell array of the oscillation circuit, but also the switch 71 is provided for the reference block to select the number of delay cells 5 of the first delay cell array of the reference block. Accordingly, for example, it is now assumed that the switch 71 can select 16, 15, 14 or 13 as the number of delay cells in the reference block and the switch 70 can select 4 or 3 as the number of delay cells in the oscillation block. In this case, the free run frequency f fr can be selected out of 16/4, 16/3, 15/4, 15/3, 14/4, 14/3, 13/4 and 13/3 times the reference clock frequency. By thus setting the number of delay cells in the reference block and the oscillation block and switches in various ways, a greater number of free run frequencies can be generated by using one reference clock frequency.

A third embodiment will now be described by referring to FIG. 3.

Figure 3:
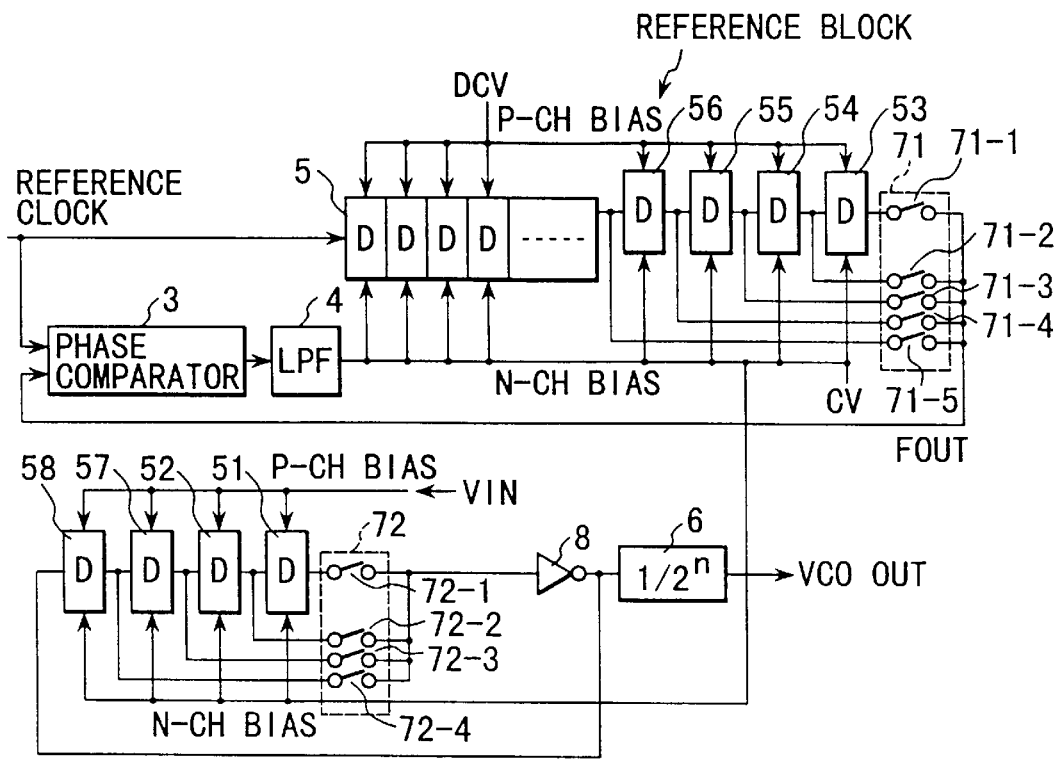
FIG. 3 is a block diagram of a VCO circuit according to a third embodiment of the present invention.

FIG. 3 shows a block diagram of a conventional VCO circuit, and the VCO circuit is of delay line ring oscillator type used in general within semiconductor integrated circuits (LSIs) of CMOS structure. This embodiment basically has the same structure as those of the VCO circuits shown in FIGS. 1 and 2, except for those portions relating to the switches. Therefore, the same portions are designated by the same reference numerals, and the description thereof will be omitted.

As shown in FIG. 3, also in this embodiment, similarly to the first embodiment as shown in FIG. 2, the switch 71 is provided for the reference block to select the number of delay cells 5 of the first delay cell array of the reference block. Moreover, in this embodiment, a switch 72 is provided for the oscillation block to select the number of delay cells 5 of the second delay cell array of the oscillation block. In this embodiment, the switch 70 provided for the delay cell array in the VCO circuits shown in the first and second embodiments of FIGS. 1 and 2 is changed to the switch 72. The switch 72 can select the number of delay cells in the first delay cell array more than those in the first and second embodiments.

The switch 71 can disconnect at least one delay cell 5 of the first delay cell array of the reference block from the first delay cell array of the reference block. The switches 71-1, 71-2, 71-3, and 71-4 are provided at the output sides of delay cells 53, 54, 55 and 56, respectively. The switch 71-5 is provided at the input side of the delay cell 56. That is, the switch 71-1 is connected between the output terminal of the delay cell 53 and the output terminal of the first delay cell array of the reference block, the switch 71-2 is connected between the output terminal of the delay cell 54 and the output terminal of the first delay cell array of the reference block, the switch 71-3 is connected between the output terminal of the delay cell 55 and the output terminal of the first delay cell array of the reference block, and the switch 71-4 is connected between the output terminal of the delay cell 56 and the output terminal of the first delay cell array of the reference block. The switch 71-5 is connected between the input terminal of the delay cell 56 and the output terminal of the first delay cell array of the reference block.

In operation, the switch 71 can disconnect at least one delay cell 5 of the first delay cell array of the reference block from the first delay cell array of the reference block. For example, when the switch 71-1 is turned on and the switches 71-2, 71-3, 71-4, and 71-5 are turned off, then none of the delay cells 53, 54, 55, and 56 is disconnected from the first delay cell array and the number of delay cells 5 becomes maximum. Also, for example, when the switch 71-2 is turned on and the switches 71-1, 71-3, 71-4, and 71-5 are turned off, then the delay cell 53 is disconnected from the first delay cell array and the number of delay cells 5 is reduced by one from the maximum. Similarly, when the switch 71-3 is turned on and the switches 71-1, 71-2, 71-4, and 71-5 are turned off, then the delay cells 53 and 54 are disconnected from the first delay cell array and the number of delay cells 5 is reduced by two from the maximum. Likewise, when the switch 71-4 is turned on and the switches 71-1, 71-2, 71-3, and 71-5 are turned off, then the delay cells 53 to 55 are disconnected from the first delay cell array and the number of delay cells 5 is reduced by three from the maximum. Further, when the switch 71-5 is turned on and the switches 71-1, 71-2, 71-3, and 71-4 are turned off, then the delay cells 53 to 56 are disconnected from the first delay cell array and the number of delay cells 5 is reduced by four from the maximum. In this way, by operating the switch 71, the delay cell 53, the delay cells 53 and 54, the delay cells 53 to 55, and the delay cells 53 to 56 can be selectively disconnected from the second delay cell array of the oscillation block.

The switch 72 can disconnect at least one delay cell 5 of the second delay cell array of the oscillation block from the second delay cell array of the reference block. The switches 72-1, 72-2, 72-3, and 72-4 are provided at the output sides of delay cells 51, 52, 57 and 58, respectively. That is, the switch 72-1 is connected between the output terminal of the delay cell 51 and the input terminal of the inverter 8, the switch 72-2 is connected between the output terminal of the delay cell 52 and the input terminal of the inverter 8, the switch 72-3 is connected between the output terminal of the delay cell 57 and the input terminal of the inverter 8, and the switch 72-4 is connected between the output terminal of the delay cell 58 and the input terminal of the inverter 8. In operation, the switch 72 can disconnect at least one delay cell 5 of the second delay cell array of the oscillation block from the second delay cell array of the oscillation block. For example, when the switch 72-1 is turned on and the switches 72-2, 72-3, and 72-4 are turned off, then none of the delay cells 51, 52, 57, and 58 is disconnected from the second delay cell array of the oscillation block and the number of delay cells 5 becomes maximum. Also, for example, when the switch 72-2 is turned on and the switches 71-1, 71-3, and 71-4 are turned off, then the delay cell 51 is disconnected from the second delay cell array and the number of delay cells 5 is reduced by one from the maximum. Similarly, when the switch 72-3 is turned on and the switches 71-1, 71-2, and 71-4 are turned off, then the delay cells 51 and 52 are disconnected from the second delay cell array of the oscillation block and the number of delay cells 5 is reduced by two from the maximum. Likewise, when the switch 72-4 is turned on and the switches 71-1, 71-2, and 71-3 are turned off, then the delay cells 51, 52, and 57 are disconnected from the second delay cell array of the oscillation block and the number of delay cells 5 is reduced by three from the maximum. In this way, by operating the switch 72, the delay cell 51, the delay cells 51 and 52, and the delay cells 51, 52, and 57 can be selectively disconnected from the second delay cell array of the oscillation block.

As heretofore described with reference to FIG. 3, in this embodiment (third embodiment), the switch 70 provided for the delay cell array in the VCO circuits shown in the first and second embodiments of FIGS. 1 and 2 is changed to the switch 72. The switch 72 can select the number of delay cells in the first delay cell array more than those selected by the switch 70 in the first and second embodiments. In operation, for example, it is now assumed that the switch 71 can select 16, 15, 14 or 13 as the number of delay cells in the reference block and the switch 72 can select 4, 3, 2 or 1 as the number of delay cells in the oscillation block. In this case, the free run frequency ffr can be selected out of 16/4, 16/3, 16/2, 16/1, 15/4, 15/3, 15/2, 15/1, 14/4, 14/3, 14/2, 14/1, 13/4, 13/3, 13/2, and 13/1 times the reference clock frequency. In this embodiment (third embodiment), the switch 72 is used in place of the switch 70 provided for the second delay cell array in the VCO circuits shown in the first and second embodiments of FIGS. 1 and 2, and the switch 72 can select the number of delay cells in the first delay cell array more than those selected by the switch 70, and accordingly a number of free run frequencies greater than that obtained in the second embodiment can be obtained.

A clocked inverter circuit can be typically used as the switches used in the above-mentioned embodiments.

Figure 4:
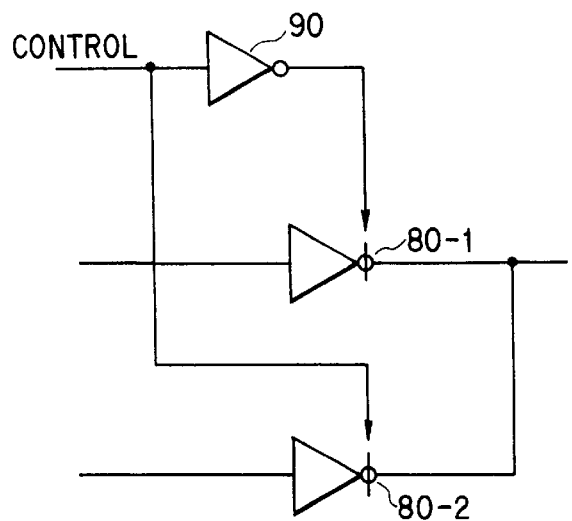
FIG. 4 is a circuit diagram of the switch used in the delay cell arrays in the VCO circuit.
Figure 5:
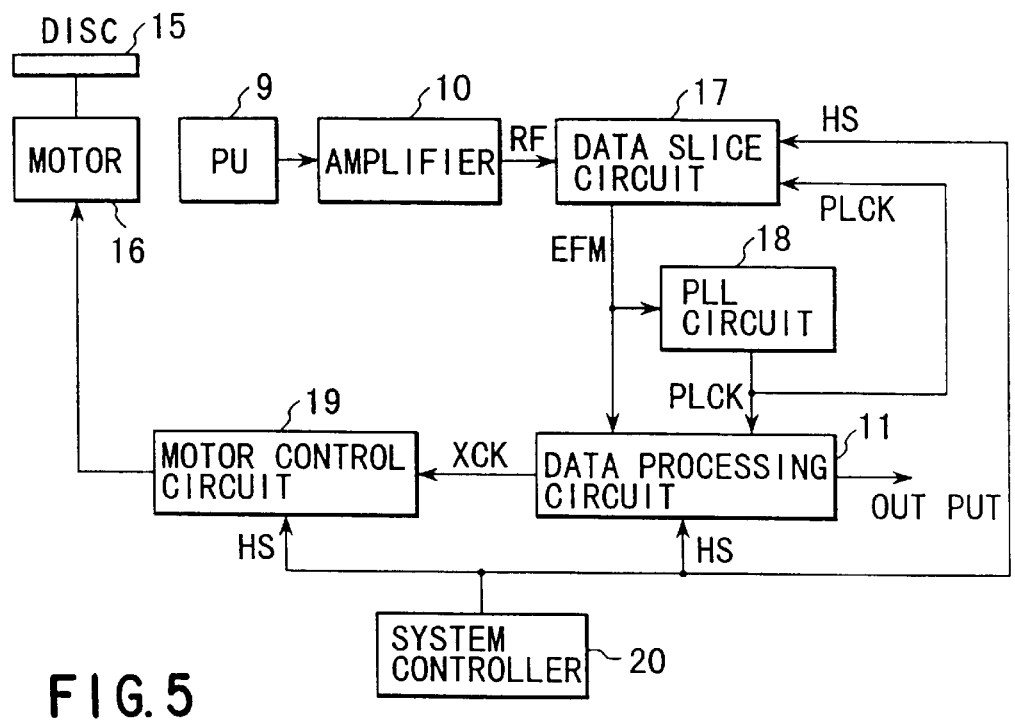
FIG. 5 is a block diagram of a conventional disc reproducing apparatus.
Figure 6:
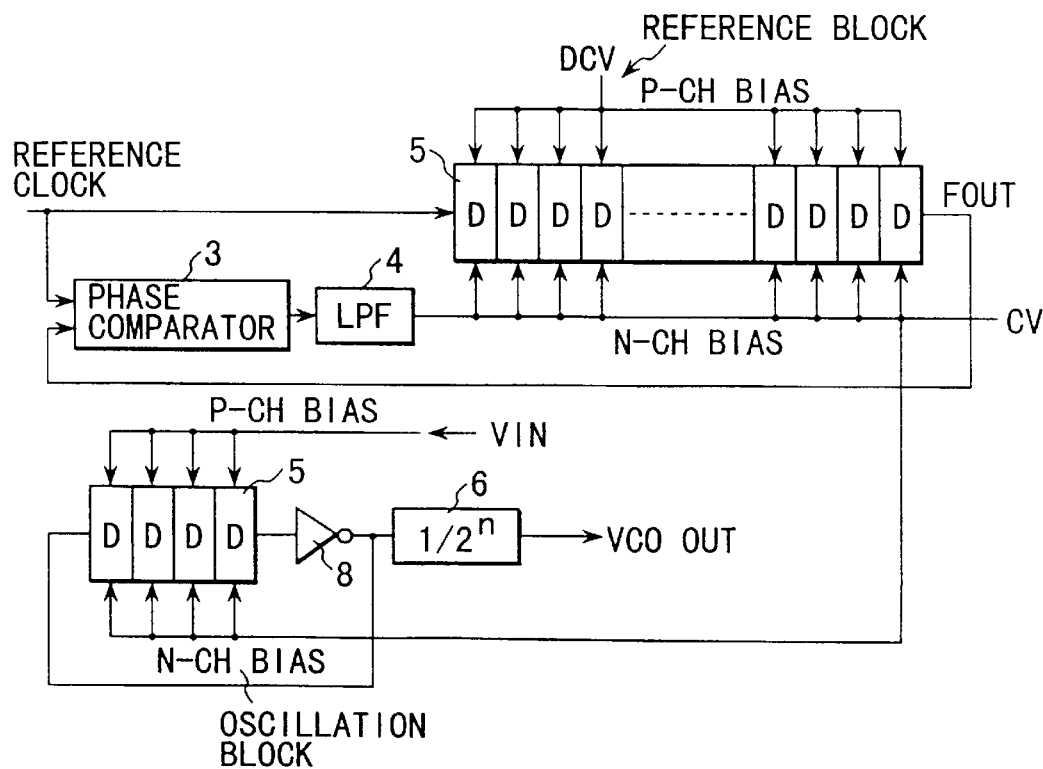
FIG. 6 is a block diagram of a conventional VCO circuit.

For example, a structure of the clocked inverter circuit of the switch 70 may be as shown in FIG. 4. The clocked inverter comprises a first clocked inverter 80-1 corresponding to the switch 70-1 (FIG. 1), a second clocked inverter 80-2 corresponding to the switch 70-2, and an inverter 90. A control signal is inputted directly to the gate of the first clocked inverter 80-1. The control signal is also inputted through the inverter 90 to the gate of the second clocked inverter 80-2. The first and second clocked inverters 80-1 and 80-2 are selectively driven in accordance with the logic level of the control signal.

In the conventional VCO circuit, the number of delay cells in each of the reference block and the oscillation block is fixed. Therefore, when the first control voltage signal DCV is fixed, only one free run frequency can be obtained for one reference clock so that only the signals of frequencies of the frequency division ratio of ½$^n$ can be obtained. In the case where the signals of the frequencies having frequency division ratios other than ½$^n$ were desired to be obtained, two or more reference clocks had to be used. According to the present invention, however, a plurality of free run frequencies can be obtained by using one reference clock. Therefore, expensive reference clock generators using crystal resonators can be decreased, resulting in a significantly reduced cost. Furthermore, since the oscillation circuit can be reduced, the power dissipation can also be reduced.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A voltage controlled oscillator circuit comprising:
a first delay cell array including a plurality of delay cells each having a first gate for receiving a first control voltage signal and a second gate, the first delay cell array having an input terminal for receiving a reference clock signal and an output terminal for outputting a delayed clock signal of the reference clock signal;
a ring oscillator having a second delay cell array including a plurality of delay cells each having a first gate for receiving a second control voltage signal and a second gate, the second delay cell array having an input terminal and an output terminal, the ring oscillator for outputting from the output terminal of the second delay cell array a signal of a frequency determined by a time delay of the second delay cell array;
a selection circuit provided for at least one of the first and second delay cell arrays, for selecting the number of delay cells out of said at least one delay cell array; and
a phase detector for comparing in phase the reference clock signal with the delayed clock signal outputted by said first delay cell array to output a comparison signal, and inputting the comparison signal to the second gates of the delay cells of the first delay cell array and the second gates of the delay cells of the second delay cell array.

2. A voltage controlled oscillator circuit according to claim 1, wherein said selection circuit selects the number of delay cells in the first delay cell array.

3. A voltage controlled oscillator circuit according to claim 1, wherein said selection circuit selects the number of delay cells in the second delay cell array.

4. A voltage controlled oscillator circuit according to claim 1, wherein said selection circuit selects the number of delay cells in the first delay cell array and the number of delay cells in the second delay cell array.

5. A voltage controlled oscillator circuit according to claim 2, wherein said selection circuit comprises a disconnecting circuit for disconnecting from the first delay cell array at least one of the delay cells of the first delay cell array.

6. A voltage controlled oscillator circuit according to claim 3, wherein said selection circuit comprises a disconnecting circuit for disconnecting from the second delay cell array at least one of the delay cells of the second delay cell array.

7. A voltage controlled oscillator circuit according to claim 4, wherein said selection circuit comprises a first disconnecting circuit for disconnecting from the first delay cell array at least one of the delay cells of the first delay cell array, and a second disconnecting circuit for disconnecting from the second delay cell array at least one of the delay cells of the second delay cell array.

8. A voltage controlled oscillator circuit according to claim 5, wherein said disconnecting circuit comprises a switch connected between the output terminal of the first delay cell array and an input terminal of one of the delay cells of the first delay cell array.

9. A voltage controlled oscillator circuit according to claim 6, wherein said disconnecting circuit comprises a switch connected between the output terminal of the second delay cell array and an input terminal of one of the delay cells of the second delay cell array.

10. A voltage controlled oscillator circuit according to claim 7, wherein said first disconnecting circuit comprises a switch connected between the output terminal of the first delay cell array and an input terminal of one of the delay cells of the first delay cell array, and said second disconnecting circuit comprises a switch connected between the output terminal of the second delay cell array and an input terminal of one of the delay cells of the second delay cell array.

11. A voltage controlled oscillator circuit according to claim 8, wherein said switch of the disconnecting circuit comprises a clocked inverter connected between the output terminal of the first delay cell array and the input terminal of one of the delay cells of the first delay cell array.

12. A voltage controlled oscillator circuit according to claim 9, wherein said switch of the disconnecting circuit comprises a clocked inverter connected between the output terminal of the second delay cell array and the input terminal of one of the delay cells of the second delay cell array.

13. A voltage controlled oscillator circuit according to claim 10, wherein said switch of the first disconnecting circuit comprises a clocked inverter connected between the output terminal of the first delay cell array and the input terminal of one of the delay cells of the first delay cell array, and said switch of the second disconnecting circuit comprises a clocked inverter connected between the output terminal of the second delay cell array and the input terminal of one of the delay cells of the second delay cell array.

14. A voltage controlled oscillator circuit according to claim 1, further comprising a low pass filter for receiving the comparison signal outputted from the phase detector, the comparison signal outputted from the phase detector being inputted via the low pass filter to the second gates of the delay cells of the first delay cell array and the second gates of the delay cells of the second delay cell array.

15. A voltage controlled oscillator circuit according to claim 1, further comprising a frequency division circuit for frequency dividing an output signal of the second delay cell array by frequency division ratio of ½$^n$.

16. A voltage controlled oscillator circuit according to claim 15, further comprising an inverter for receiving the output signal of the second delay cell array to invert an logic level of the output signal of the second delay cell array, the output signal of the second delay cell array being inputted via the inverter to the frequency division circuit.

17. A voltage controlled oscillator circuit according to claim 1, wherein each of said delay cells in the first and second delay cell arrays comprises a transfer gate for receiving an input signal to output a delayed signal, and an inverter for receiving the delayed signal outputted from the transfer gate to invert a logic level of the delayed signal of the transfer gate.

18. A voltage controlled oscillator circuit according to claim 17, wherein the transfer gate of each of the delay cells of the first delay cell array comprises a pair of P channel MOS transistor and N channel MOS transistor whose drain-source paths are connected in parallel to each other and whose gates receive the first control voltage signal and the comparison signal outputted from the phase detector, respectively.

19. A voltage controlled oscillator circuit according to claim 17, wherein the transfer gate of each of the delay cells of the second delay cell array comprises a pair of P channel MOS transistor and N channel MOS transistor whose drain-source paths are connected in parallel to each other and whose gates receive the second control voltage signal and the comparison signal outputted from the phase detector, respectively.

20. A disc reproducing apparatus comprising:
a photoelectric converter for optically reading data recorded on a disc and converting the data to an electric signal;
an amplifier for amplifying the electric signal outputted from the photoelectric converter;
a data slice circuit for generating a binary signal of the electric signal outputted from the amplifier;
a PLL circuit for generating a clock signal in accordance with a change of data reproduction velocity, on the basis of the binary signal generated by the data slice circuit; and
a data processing circuit for demodulating said binary signal generated by said data slice circuit to reproduce data in response to the clock signal,
wherein said PLL circuit comprises a first delay cell array including a plurality of delay cells each having a first gate for receiving a first control voltage signal and a second gate, the first delay cell array having an input terminal for receiving a reference clock signal and an output terminal for outputting a delayed clock signal of the reference clock signal;
a ring oscillator having a second delay cell array including a plurality of delay cells each having a first gate for receiving a second control voltage signal and a second gate, the second delay cell array having an input terminal and an output terminal, the ring oscillator for outputting from the output terminal of the second delay cell array a signal of a frequency determined by a time delay of the second delay cell array; a selection circuit provided for at least one of the first and second delay cell arrays, for selecting the number of delay cells out of said at least one delay cell array; and a phase detector for comparing in phase the reference clock signal with the delayed clock signal outputted by said first delay cell array to output a comparison signal, and inputting the comparison signal to the second gates of the delay cells of the first delay cell array and the second gates of the delay cells of the second delay cell array.

* * * * *